(12) United States Patent
Chung et al.

(10) Patent No.: US 8,238,065 B2
(45) Date of Patent: Aug. 7, 2012

(54) POWER CUTOFF DEVICE AUTOMATICALLY OPERATED UPON OCCURRENCE OF SPARK ON ELECTRIC WIRE

(76) Inventors: Tae Young Chung, Seoul (KR); Dea Sang Kim, Gimhae-si (KR)

( * ) Notice: Subject to any disclaimer, the term of this patent is extended or adjusted under 35 U.S.C. 154(b) by 367 days.

(21) Appl. No.: 12/595,611

(22) PCT Filed: Apr. 11, 2008

(86) PCT No.: PCT/KR2008/002051
§ 371 (c)(1),
(2), (4) Date: Oct. 12, 2009

(87) PCT Pub. No.: WO2008/127032
PCT Pub. Date: Oct. 23, 2008

(65) Prior Publication Data
US 2010/0073832 A1 Mar. 25, 2010

(30) Foreign Application Priority Data
Apr. 13, 2007 (KR) .................. 10-2007-0036271

(51) Int. Cl.
*H02H 9/08* (2006.01)
(52) U.S. Cl. ........................................ 361/42
(58) Field of Classification Search ............ 361/42
See application file for complete search history.

(56) References Cited

U.S. PATENT DOCUMENTS

| | | | | |
|---|---|---|---|---|
| 3,873,282 A | * | 3/1975 | Finch | 96/22 |
| 6,650,515 B2 | * | 11/2003 | Schmalz | 361/42 |
| 7,126,445 B1 | * | 10/2006 | McMahon et al. | 335/17 |
| 2002/0085327 A1 | | 7/2002 | Kim et al. | |
| 2002/0149891 A1 | * | 10/2002 | Neiger et al. | 361/42 |
| 2004/0070898 A1 | * | 4/2004 | McMahon et al. | 361/42 |
| 2010/0097733 A1 | * | 4/2010 | E. | 361/42 |

FOREIGN PATENT DOCUMENTS

| | | |
|---|---|---|
| JP | 2004080930 | 3/2004 |
| JP | 2005117750 | 4/2005 |
| KR | 2005/0072707 | 7/2005 |
| KR | 10-2005-0072707 | 12/2005 |
| WO | 2006/004512 | 1/2006 |

* cited by examiner

*Primary Examiner* — Ronald W Leja
(74) *Attorney, Agent, or Firm* — Christopher Paul Mitchell

(57) ABSTRACT

The present invention provides a power cutoff device automatically operated upon the occurrence of a spark on an electric wire. The power cutoff device of the present invention automatically cuts off power supply to an earth leakage breaker or an electronic switch according to a control signal transmitted by detecting an electromagnetic wave due to an electric spark generated on an electric wire by an abnormal state such as a connection failure of an electrical device, thus preventing a disaster such as an electrical fire caused by the electric spark (flame). According to the present invention, since the power cutoff device provides an intrinsic function of the earth leakage breaker that operates in a state of an overload or electric leakage and the earth leakage breaker is operated by detecting the electric spark generated on the electric wire, it is possible to effectively prevent a disaster such as an electrical fire caused by the electric spark.

10 Claims, 3 Drawing Sheets

[Figure 1]
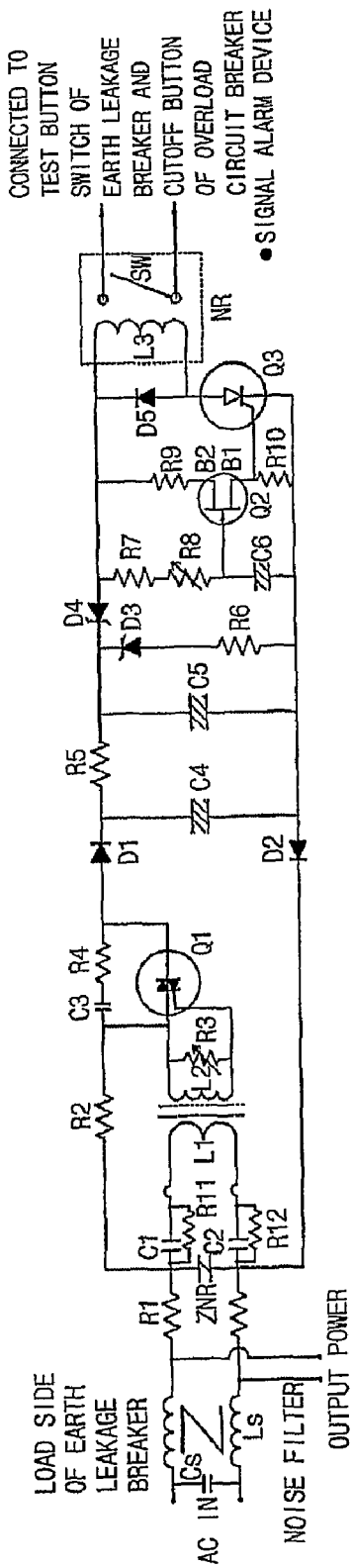

[Figure 2]
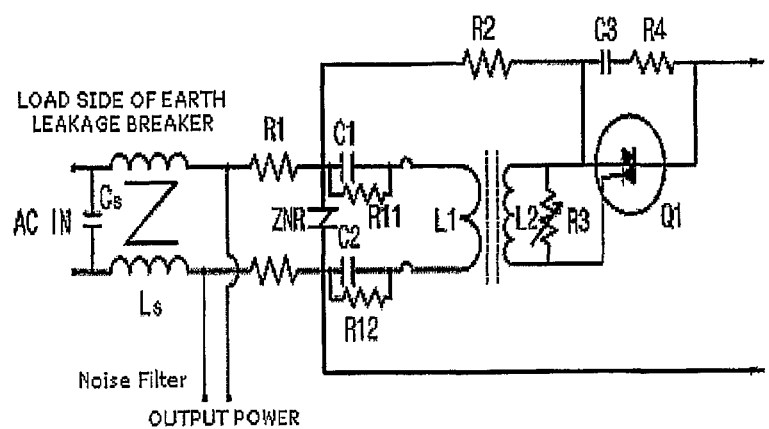
[Figure 3]
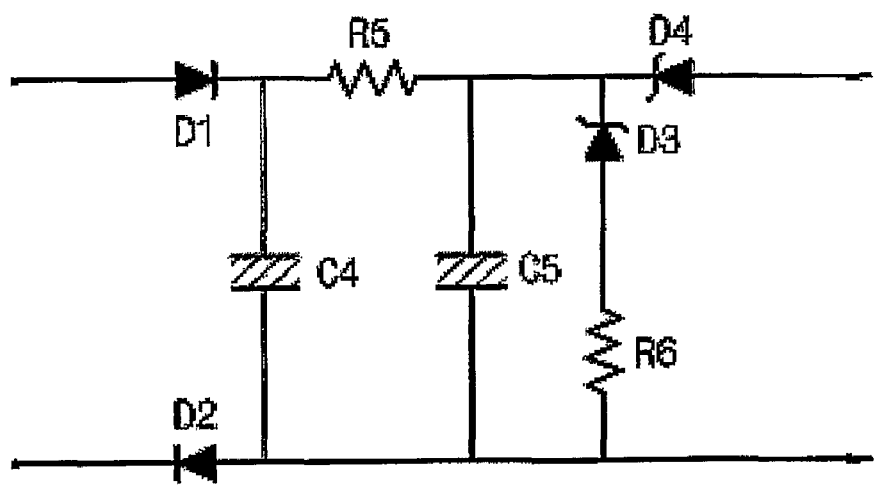

[Figure 4]
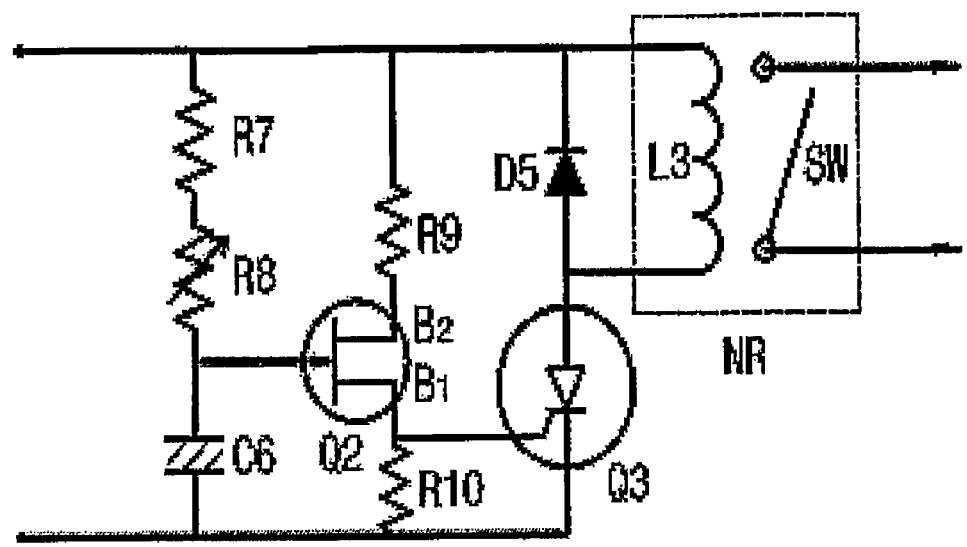

POWER CUTOFF DEVICE AUTOMATICALLY OPERATED UPON OCCURRENCE OF SPARK ON ELECTRIC WIRE

RELATED APPLICATIONS

This application is a 371 application of International Application No. PCT/KR2008/002051, filed Apr. 11, 2008, which in turn claims priority from Korean Patent Application No. 10-2007-0036271, filed Apr. 13, 2007, both of which are incorporated herein by reference.

TECHNICAL FIELD

The present invention relates to a power cutoff device automatically operated upon the occurrence of a spark on an electric wire and, more particularly, to a power cutoff device which automatically cuts off power supply to an earth leakage breaker or an electronic switch according to a control signal transmitted by detecting an electromagnetic wave due to an electric spark generated on an electric wire by an abnormal state such as a connection failure of an electrical device, thus preventing a disaster such as an electrical fire caused by the electric spark (flame).

BACKGROUND ART

In general, an earth leakage breaker is an electrical wiring device that detects an electric leakage in an electrical circuit or device that uses electricity and, if a leakage current of more than a specific level is detected, cuts off power supply, thus preventing the human body from being damaged due to an electric shock, and preventing an electrical fire from occurring caused by the electric leakage.

It is reported that the most common electrical fires are caused by an electric leakage of a house (interior) wiring; however, since the earth leakage breaker operates when a leakage current is generated, it cannot not be assumed that the cause of the most common electrical fires is the electric leakage.

In fact, the most common electrical fires occur when an electric spark is generated by a contact failure of a wiring circuit, an insulation breakdown due to heat generation at a contact point, a momentary short circuit, or a high connection resistance. In this case, the earth leakage breaker may not be operated and, if there is an inflammable material near the electric spark, it may result in a disaster However, it is difficult to inspect the contact failure of the wiring circuit contact point, and even experience experts can measure only a disconnection and a short circuit by a physical inspection or using a circuit tester.

Especially, when an electrical pipe is formed of synthetic resin (PVC), an insulation failure between electric wires in the pipe is not shown during insulation measurement, and the connection or contact failure of the electrical wiring cannot be checked before a malfunction occurs.

Moreover, the malfunction caused by the connection or contact failure of the electrical device that uses electricity may result in a considerable loss or disaster in the industrial field; however, it is very difficult to detect the same.

Meanwhile, since the conventional earth leakage breaker operates when a leakage current is continuously generated or when a current exceeding a rated current flows, it is impossible to prevent an electrical fire due to the contact failure of the contact point in the low voltage house wiring, the momentary short circuit, or a tracking between wires.

Here, the above contact failure, momentary short circuit, and tracking between wires will be described to examine their common features.

First, when the contact failure occurs, the insulating material of the wiring is deformed and the contact surface thereof is oxidized due to heat generated by the contact failure.

Accordingly, the connection resistance is increased more and more, and thereby an increase in connection heat is repeated. As a result, the insulating material is gradually carbonized or deformed to cause a short circuit between wires, and a flashover caused by the connection heat ignites an adjacent inflammable material, thus causing a fire.

Second, a very strong electric spark/arc is produced by a short circuit due to burn damage of an insulating coating or by a momentary short circuit due to a mistake during operation, thus causing a fire.

Especially, since the electric spark/arc has a low effective current, the operation of the earth leakage breaker may be delayed or it may not work.

Lastly, the electric spark/arc and flashover produced by the tracking between wires due to an insulation failure ignite an adjacent inflammable material to cause a fire.

The electrical fire occurring in the wiring system is accompanied with the overheat, electric sparks/arc, and flashover, and thus it develops in a very short moment.

Examining the characteristics of the current flow, since a very high current is rapidly changed in a unit time, the ascending and descending angles are close to a right angle, and such a current flows with an irregular impulse several times, and its effective current is very low.

In the case where the contact of the contact point in the wiring circuit is poor, the voltage supplied to a load side has an irregular impulse, and thus the current flows with an irregular impulse having a low effective current. Accordingly, it is difficult for a thermal or electromagnetic breaker to perform the cutoff operation.

That is, when the electric spark/arc having a low effective is generated, the breaking operation of the earth leakage breaker is not made.

As above, since the conventional earth leakage breaker operates in a state of an overload or electric leakage, it is impossible to prevent a disaster due to an electric spark/arc (flame) generated on an electric wire by an abnormal state such as a connection failure.

Accordingly, it is necessary to prevent a disaster due to an electric spark generated on an electric wire by an abnormal state such as a connection failure, which the conventional earth leakage breaker and the electronic switch cannot prevent.

Disclosure of Invention Technical Problem

The present invention has been made in an effort to solve the above-described problems associated with prior art, and an object of the present invention is to provided a power cutoff device which automatically cuts off power supply to an earth leakage breaker or an electronic switch according to a control signal transmitted by detecting a pulse current of an electromagnetic wave due to an electric spark generated on an electric wire by an abnormal state such as a connection failure of an electrical device, thus providing an intrinsic function of the earth leakage breaker that operates in a state of an overload or electric leakage, and effectively preventing a disaster such as an electrical fire caused by the electric spark generated on the electric wire.

Technical Solution

To accomplish the above object, the present invention provides a power cutoff device automatically operated upon occurrence of a spark on an electric wire, the power cutoff device comprising: a triac switching circuit connected to an electric wire of an output side of an earth leakage breaker or an electronic switch, and driven by a pulse current of an electromagnetic wave generated by an electric spark to apply a current; a rectifying-smoothing circuit connected to the triac switching circuit to rectify the current applied therefrom, convert the current into a direct current, and output a constant voltage after a voltage drop; and an operation delay circuit for operating a switching means for a power cutoff operation of the earth leakage breaker by delaying the flow of the current applied through the rectifying-smoothing circuit when a current is continuously supplied for a predetermined period of time.

The triac switching circuit comprises: a first side pulse transformer coil driven by the pulse current of the electromagnetic wave when a current due to the electric spark flows in a circuit in which a condenser and a resistor are connected in parallel to the electric wire of the output side of the earth leakage breaker through a circuit protection resistor; a second side pulse transformer coil to which the current flowing in the first side pulse transformer coil is induced; a variable resistor for controlling an output current of the second side pulse transformer coil; a triac triggered by the output current of the second side pulse transformer coil; and a resistor for protecting the triac from an abrupt current.

Moreover, the rectifying-smoothing circuit comprises: a diode for rectifying an input current; a smoothing condenser for removing an alternating current component from the current rectified by the diode by removing a ripple; a resistor and a condenser for the voltage drop of the direct current converted by the smoothing condenser; a first zener diode applying a current when charge of the condenser is completed; a second zener diode for maintaining a constant voltage by applying an inverse current to the condenser when a charged voltage of the condenser is higher than a predetermined value; and a resistor for limiting the current flowing in the second zener and adjusting the constant voltage.

Furthermore, the operation delay circuit comprises; a condenser charged with an applied current; a variable resistor for controlling the time required to charge the condenser; an unijunction transistor triggered when the voltage of the condenser is increased up to a predetermined value and applied as an emitter voltage; a resistor for generating a voltage when the unijunction transistor is applied with the current; a thyristor connected to the resistor and triggered when a gate thereof is supplied with the current from the resistor; a diode to which a voltage is applied when the thyristor is applied with the current; and a relay connected in parallel to the diode.

Preferably, the triac switching circuit further comprises a condenser for triggering the triac and a resistor for controlling a surge current, of the condenser.

More preferably, the triac switching circuit further comprises an electromagnetic interference (EMI) filter for removing a nose of an electric signal input to an electric wire of an input side of the earth leakage breaker or the electronic switch.

More preferably, the triac switching circuit further comprises a voltage nonlinear resistor for protecting the circuit by absorbing a high surge voltage input from the input side of the earth leakage breaker.

Moreover, the relay comprises a coil and a switch, the switch being turned on when the coil is excited.

Furthermore, the operation delay circuit comprises a semiconductor contactless switch such as a La-SCR or a La-SCS as the switching means for the power cutoff operation of the earth leakage breaker.

Suitably, the operation delay circuit further comprises a display lamp or an alarm device connected to the switching means and operated upon the occurrence of an electric spark on an electric wire.

Advantageous Effects

According to the power cutoff device in accordance with the present invention, the earth leakage breaker is automatically operated according to a control signal transmitted by detecting a pulse current of an electromagnetic wave generated by an electric spark generated on an electric wire by an abnormal state such as a connection failure of an electrical device, thus preventing a disaster such as an electrical fire caused by the electric spark (flame).

Especially, according to the present invention, since the power cutoff device provides an intrinsic function of the earth leakage breaker that operates in a state of an overload or electric leakage and the earth leakage breaker is operated by detecting an electric spark generated on an electric wire, it is possible to effectively prevent a disaster such as an electrical fire caused by the electric spark.

BRIEF DESCRIPTION OF THE DRAWINGS

FIG. 1 is a circuit diagram of a power cutoff device in accordance with the present invention; and FIGS. 2 to 4 are circuit diagrams showing respective circuits constituting the power cutoff device in accordance with the present invention, in which FIG. 2 shows a triac switching circuit, FIG. 3 shows a rectifying-smoothing circuit, and FIG. 4 shows an operation delay circuit.

MODE FOR THE INVENTION

Hereinafter, preferred embodiments in accordance with the present invention will be described with reference to the accompanying drawings. The preferred embodiments are provided so that those skilled in the art can sufficiently understand the present invention, but can be modified in various forms and the scope of the present invention is not limited to the preferred embodiments.

FIG. 1 is a circuit diagram of a power cutoff device in accordance with the present invention, and FIGS. 2 to 4 are circuit diagrams showing respective circuits constituting the power cutoff device in accordance with the present invention, in which FIG. 2 shows a triac switching circuit, FIG. 3 shows a rectifying-smoothing circuit, and FIG. 4 shows an operation delay circuit.

A commercially available earth leakage breaker (ELB), which is automatically operated to cut off power in a state of an overload or an electric leakage by an electrical signal input from the outside, may be used in the present invention. Moreover, the present invention provides a power cutoff device inserted into the earth leakage breaker to provide an intrinsic function of the earth leakage breaker, thus preventing a disaster such as an electrical fire caused by an electric spark.

In general, the earth leakage breaker includes a test button switch for determining whether the earth leakage breaker is in a normally operable state or not. Only by pressing down the test button switch, it is possible to easily determine whether or not it operates normally. When a contact point of the test button switch is turned on, a cutoff circuit mounted in the earth leakage breaker is shorted, and thus the power is cut off.

The power cutoff device in accordance with the present invention is inserted into an electric wire of an output side of the earth leakage breaker to cut off an electric spark generated on the electric wire.

The power cutoff device in accordance with the present invention includes a triac switching circuit (shown in FIG. 2) triggered by a pulse current of an electromagnetic wave generated by an electric spark and applying a current, a rectifying-smoothing circuit (shown in FIG. 3) connected to the triac switching circuit to rectify the current applied therefrom, convert the current into a complete direct current by removing a ripple, and output a constant voltage, and an operation delay circuit (shown in FIG. 4) that turns on a relay (NR) by delaying the flow of the current passing through the rectifying-smoothing circuit only when an electric spark is continuously generated.

The respective circuits of the power cutoff device of the present invention will be described below.

First, the triac switching circuit will be described in more detail.

In the case where an electric spark is generated on an electric wire of an output side of the earth leakage breaker, an electromagnetic wave flows along the electric wire of the output side, and the triac switching circuit is driven by a pulse current of the electromagnetic wave.

As a preferred embodiment, an input side of the iliac switching circuit is connected to the electric wire of the output side of the earth leakage breaker through an electromagnetic interference (EMI) filter including a condenser Cs and a coil Ls, a circuit protection resistor R1, resistors RI 1 and R12 for a pulse current supply circuit, and ceramic condensers C1 and C2 for controlling a surge current. The triac switching circuit includes a first side pulse transformer coil L1 wound on a ferrite coil connected in parallel to the ceramic condensers C1 and C2 and the resistors RI 1 and R 12, a second side pulse transformer coil L2 wound on the ferrite coil together with the first side pulse transformer coil L1, to which a current flowing in the first side pulse transformer coil L1 is induced, a variable resistor R3 for controlling the output current of the second side pulse transformer coil L2, and a triac triggered by the output current of the second side pulse transformer coil L2.

Moreover, the triac switching circuit, includes a voltage nonlinear resistor (ZNR) for protecting the circuit by absorbing a high surge voltage input from a load of the earth leakage breaker, a resistor R2 for protecting the triac Q1 from an abrupt current (instantaneous peak current), a film condenser C3 for enabling the triac Q1 to be triggered using a voltage generated from a cathode and an anode of the triac Q1 when the trigger is not activated due to a lack of a gate current during triggering of the triac Q1, and a resistor R4 for controlling a surge current of the film condenser C3.

When a current of the input power, applied from the electric wire of the output side of the earth leakage breaker, i.e., from the load side of the earth leakage breaker, flows in the first side pulse transformer coil L1 of the above-described the triac switching circuit of the present invention through the circuit protection resistor R1, the ceramic condensers C1 and C2, and the resistors RI 1 and R12, the first side pulse transformer coil L1 is excited and thus the second side pulse transformer coil L2 is mutually induced. As a result, the output current is adjusted by the variable resistor R3 connected to the second side pulse transformer coil L2.

At this time, the first side pulse transformer coil L1 is driven only by a peak wavelength of the pulse current of the electromagnetic wave due to an electric spark input from the load of the earth leakage breaker. The current output according to a resistance value of the variable resistor R3 flows in a gate of the triac Q1 to trigger the triac Q1, and thus the current passing through the circuit protection resistor R1 and the triac protection resistor R2 flows in the triac Q1.

Here, the condenser Cs of the EMI filter (noise filter) mitigates the noise having a frequency higher than that of the current generated by a spark of an electrical signal input to the electric wire of the output side of the earth leakage breaker or an electronic switch. As a result, it is possible to prevent a malfunction due to the electric spark current in the external electric wire and prevent the inside spark current from flowing out.

The pulse current of the electromagnetic wave passing through the triac Q1 operated (triggered) as described above is applied to the rectifying-smoothing circuit. The rectifying-smoothing circuit includes diodes D1 and D2 for rectifying the current passing through the triac Q1, a smoothing condenser C4 for removing an alternating current component from the current rectified by the diodes D1 and D2, a voltage dropping resistor R5 and an electrolytic condenser C5 that serve as a filter, a first zener diode D4 for controlling the current flowing in the operation delay circuit, and a second zener diode D3 and a resistor R6 that supply a constant voltage to the operation delay circuit.

The minus component of the applied alternating current is removed by the diodes D1 and D2 and rectified to a ripple. The ripple is converted into a stable direct current as the alternating current component is removed by the smoothing condenser C4 connected in parallel between the diodes D1 and D2. A large voltage drop is caused by a high resistance of the voltage dropping resistor R5, and the resulting current is charged in the electrolytic condenser C5. In this case, the first zener diode D4 connected to the electrolytic condenser C5 controls the current flowing in the operation delay circuit until the charge of the electrolytic condenser C5 is completed.

The second zener diode D3 and the resistor R6 supply a constant voltage to the operation delay circuit by applying an inverse current to the electrolytic condenser C5 when the charged voltage of the electrolytic condenser C5 is higher than a predetermined value. At this time, the resistor R6 for adjusting a constant voltage limits the current flowing in the second zener diode D3, which may be easily damaged by the applied current, to protect the same, and adjusts the voltage supplied to the operation delay circuit.

The operation delay circuit includes a resistor R7 and a variable resistor R8, in which the current passing though the first zener diode D4 flows, an electrolytic condenser C6, of which charging time is controlled by the resistor R7 and the variable resistor R8, a unijunction transistor Q2 triggered by the voltage of the electrolytic condenser C6, resistors R9 and RIO connected to bases B2 and B1 of the unijunction transistor Q2, a thyristor Q3, of which a gate and a cathode are connected to both ends of the resistor R10, a diode D5 connected to an anode of the thyristor Q3, and a relay NR connected in parallel to the diode D5.

The relay NR includes a coil L3 and a switch SW connected in parallel to the diode D5.

When a constant voltage capable of driving the operation delay circuit having the above-described configuration is maintained at the anode of the first zener diode D4 and both ends of the diode D2 of the rectifying-smoothing circuit, the current passing through the first zener diode D4 is applied to the resistor R7 and the variable resistor R8 connected to the anode of the first zener diode D4 and then slowly charged in the electrolytic condenser C6. Then, when the voltage of the electrolytic condenser C6 is gradually increased and reaches a voltage capable of driving an emitter for triggering the unijunction transistor Q2, the unijunction transistor Q2 operates and thus a current flows in both bases B2 and B1 of the unijunction transistor Q2.

At this time, the resistor R7 and the variable resistor R8 control the charging rate of the electrolytic condenser C6 to adjust the time required to charge the electrolytic condenser C6. That is, the resistance value of the variable resistor R8 is adjusted to control the charging rate of the electrolytic condenser C6, thus delaying the time required to drive the unijunction transistor Q2. As a result, the unijunction transistor Q2 is driven a few seconds after the pulse current of the electromagnetic wave generated by the electric spark is applied as an input signal. The reason for this is to prevent a malfunction due to an instantaneous spark current generated during on/off of the switch SW and the like.

After the unijunction transistor Q2 is driven, the current is applied from the base B2 to the base B1 of the unijunction transistor Q2 via the resistor R9 connected to the first toner diode D4, and thus a voltage is generated at both ends of the resistor R10 that controls a gate current of the thyristor Q3. As a result, a current, flows between the gate and the cathode of the thyristor Q3 connected to both ends of the resistor R10 to trigger the thyristor Q3. In the triggered thyristor Q3, the current flows from the anode to the cathode, and thus a voltage capable of driving the relay NR is applied to both ends of the diode. The voltage is directed to a voltage obtained by subtracting an instantaneous voltage drop of the thyristor Q3 from the voltage at both ends of the first zener diode D4 and the diode D2.

Of course, the operation delay circuit may be substituted with a semiconductor circuit having another configuration.

With the voltage of the diode D5, the coil L3 of the relay NR is excited, and thus the switch SW is turned on. As a result, the test button switch of the earth leakage breaker connected to the relay NR is closed, and thus the earth leakage breaker is turned off.

The relay NR of the operation delay circuit is a switching means for the power cutoff operation of the earth leakage breaker, and the relay NR may be substituted with a semiconductor contactless switch such as a La-SCR or La-SCS.

In case of an overload circuit breaker, an electromagnetic solenoid device is provided so as to press down a cutoff button and controlled by a relay of the circuit.

Like this, the power cutoff device of the present invention is driven only by a pulse current of an electromagnetic wave having a large wavelength generated by an electric spark on an electric wire. Moreover, since the noise having a frequency higher than that of the current wavelength by the electric spark is reduced by the ceramic condensers C1 and C2 and the resistors RI 1 and R12 of the pulse current supply circuit to through circuit of an ultra-low frequency signal, i.e., a shock wave) of the triac switching circuit and thus the first side pulse transformer coil L1 is not driven, the iliac switching circuit is not triggered.

Meanwhile, since the first zener diode D4 does not apply a current to the operation delay circuit when the voltage output from the rectifying-smoothing circuit does not reach a predetermined level, the current is cut off when it does not each an operation voltage, thus preventing a malfunction.

In case of an intermittent electric spark, the operation delay circuit does not turn on the switch SW of the relay NR. That is, the operation delay circuit turns on the switch. SW of the relay NR to turn off the earth leakage breaker only when an electric spark is continuously generated for a predetermined period of time, thus preventing a malfunction due to the intermittent spark.

In other words, the operation delay circuit turns on the relay NR connected to the test button switch of the earth leakage breaker to turn on the test button switch of the earth leakage breaker when a constant voltage by a continuous electric spark for a predetermined period of time is sufficiently applied thereto, thus cutting off the power of the earth leakage breaker.

Meanwhile, it is possible to configure a display lamp or an alarm device operated upon the occurrence of an electric spark on an electric wire using the circuit of the present invention.

Moreover, it is possible to insert the circuit of the present invention into an electrical wiring device such as an outlet so as to automatically cut off the power upon the occurrence of an electric spark on an electric wire.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

The invention claimed is:

1. A power cutoff device automatically operated upon occurrence of a spark on an electric wire, the power cutoff device comprising:
   a triac switching circuit connected to an electric wire of an output side of an earth leakage breaker or an electronic switch, and driven by a pulse current of an electromagnetic wave generated by an electric spark to apply a current;
   a rectifying-smoothing circuit connected to the triac switching circuit to rectify the current applied therefrom, convert the current into a direct current, and output a constant voltage after a voltage drop; and
   an operation delay circuit for operating a switching means for a power cutoff operation of the earth leakage breaker by delaying the flow of the current applied through the rectifying-smoothing circuit when a current is continuously supplied for a predetermined period of time.

2. The power cutoff device of claim 1, wherein the triac switching circuit comprises:
   a first side pulse transformer coil driven by the pulse current of the electromagnetic wave when a current due to the electric spark flows in a circuit in which a condenser and a resistor are connected in parallel to the electric wire of the output side of the earth leakage breaker through a circuit protection resistor;
   a second side pulse transformer coil to which the current flowing in the first side pulse transformer coil is induced;
   a variable resistor for controlling an output current of the second side pulse transformer coil;
   a triac triggered by the output current of the second side pulse transformer coil; and
   a resistor for protecting the triac from an abrupt current.

3. The power cutoff device of claim 1, wherein the rectifying-smoothing circuit comprises:
   a diode for rectifying an input current;
   a smoothing condenser for removing an alternating current component from the current rectified by the diode by removing a ripple;
   a resistor and a condenser for the voltage drop of the direct current converted by the smoothing condenser;
   a first zener diode applying a current when charge of the condenser is completed;
   a second zener diode for maintaining a constant voltage by applying an inverse current to the condenser when a charged voltage of the condenser is higher than a predetermined value; and
   a resistor for limiting the current flowing in the second zener and adjusting the constant voltage.

4. The power cutoff device of claim 1, wherein the operation delay circuit comprises:
   a condenser charged with an applied current;
   a variable resistor for controlling the time required to charge the condenser;
   an unijunction transistor triggered when the voltage of the condenser is increased up to a predetermined value and applied as an emitter voltage;
   a resistor for generating a voltage when the unijunction transistor is applied with the current;
   a thyristor connected to the resistor and triggered when a gate thereof is supplied with the current from the resistor;
   a diode to which a voltage is applied when the thyristor is applied with the current; and
   a relay connected in parallel to the diode.

5. The power cutoff device of claim 2, wherein the triac switching circuit further comprises a condenser for triggering the triac and a resistor for controlling a surge current of the condenser.

6. The power cutoff device of claim 2, wherein the triac switching circuit further comprises an electromagnetic interference (EMI) filter for removing a noise of an electric signal input to an electric wire of an input side of the earth leakage breaker or the electronic switch.

7. The power cutoff device of claim 2, wherein the triac switching circuit further comprises a voltage nonlinear resistor for protecting the circuit by absorbing a high surge voltage input from the input side of the earth leakage breaker.

8. The power cutoff device of claim 4, wherein the relay comprises a coil and a switch, the switch being turned on when the coil is excited.

9. The power cutoff device of claim 1, wherein the operation delay circuit comprises a semiconductor contactless switch such as a La-SCR or a La-SCS as the switching means for the power cutoff operation of the earth leakage breaker.

10. The power cutoff device of claim 1, wherein the operation delay circuit further comprises a display lamp or an alarm device connected to the switching means and operated upon the occurrence of an electric spark on the electric wire.

\* \* \* \* \*